United States Patent [19]

van Andel et al.

[11] Patent Number: 5,212,625
[45] Date of Patent: May 18, 1993

[54] SEMICONDUCTOR MODULE HAVING PROJECTING COOLING FIN GROUPS

[75] Inventors: Eleanor van Andel, Lk Fleringen; Carolina A. M. C. Dirix, Westervoort, both of Netherlands

[73] Assignee: Akzo NV, Arnhem, Netherlands

[21] Appl. No.: 788,057

[22] Filed: Nov. 5, 1991

Related U.S. Application Data

[63] Continuation of Ser. No. 444,085, Nov. 30, 1989, abandoned.

[30] Foreign Application Priority Data

Dec. 1, 1988 [NL] Netherlands ............ 8802957
Dec. 1, 1988 [NL] Netherlands ............ 8802958

[51] Int. Cl.$^5$ .................................... H05K 7/20
[52] U.S. Cl. ............................ 361/383; 165/185; 174/16.3; 361/386; 257/712
[58] Field of Search ............... 357/81, 82; 174/15.1, 174/16.3; 165/80.2, 80.3, 80.4, 185, 104.33; 361/382–389, 396, 398

[56] References Cited

U.S. PATENT DOCUMENTS

| | | | |
|---|---|---|---|
| 3,694,699 | 9/1972 | Snyder | 361/387 |
| 4,296,455 | 10/1981 | Leaycraft | 361/383 |
| 4,421,161 | 12/1983 | Romania | 357/81 |
| 4,442,450 | 4/1984 | Lipshutz | 357/81 |
| 4,450,505 | 5/1984 | Mittal et al. | 361/386 |
| 4,768,581 | 9/1988 | Botwald | 165/80.3 |
| 4,777,560 | 10/1988 | Herrell | 361/384 |
| 4,782,893 | 11/1988 | Thomas | 165/185 |
| 4,812,949 | 3/1989 | Fontan | 361/386 |
| 5,150,748 | 9/1992 | Blackmon | 165/41 |
| 5,158,136 | 10/1992 | Azar | 165/185 |

FOREIGN PATENT DOCUMENTS

| | | |
|---|---|---|
| 0065686 | 12/1982 | European Pat. Off. . |
| 0082051 | 1/1984 | European Pat. Off. . |
| 58-200560 | 11/1983 | Japan . |
| 0110715 | 10/1961 | Netherlands . |

OTHER PUBLICATIONS

"Thermal Management of Air— and Liquid–Cooled Multichip Modules", *IEEE Transactions on Components, Hybrids and Manufacturing Technology*, vol. CHMT-10, No. 2, Jun. 1987, pp. 159–175.

IBM Technical Disclosure Bulletin vol. 21, No. 5, Oct. 1978, New York, article "Bush-tipped Piston for Thermal Conduction", R. G. Dessauer et al., p. 1857.

*Electronics & Power*, vol. 18, Jun. 1972 (Hitchen GB), article "Spherical Diamond Heatsinks" (p. 235).

*Primary Examiner*—Gerald P. Tolin
*Attorney, Agent, or Firm*—Louis A. Morris; Richard P. Fennelly

[57] ABSTRACT

A semiconductor module with provisions for improved cooling and interconnection so as to allow for maximum chip packaging density. Air cooling is brought about by a zig-zag arrangement of groups of thin wire cooling fins mounted on a heat dissipating conductor unit also providing the necessary mechanical rigidity of the module.

The interconnection comprises a layer containing grains, preferably diamond, leaving high electrically insulating and high thermally conductive properties.

13 Claims, 6 Drawing Sheets

SEMICONDUCTOR MODULE HAVING PROJECTING COOLING FIN GROUPS

This is a continuation of application Ser. No. 07/444,085 filed Nov. 30, 1989, now abandoned.

BACKGROUND OF THE INVENTION

The invention relates to a semiconductor module comprising one semiconductor chip which at its back side is connected directly or indirectly to a heat dissipating conductor unit (or heat sink), such as a metal heat spreader plate.

Such a semicondutor module, also called a multichip module, is generally known. In such semiconductor modules the transfer of heat generated in the device in operation commonly presents a problem. Each chip consisting of, say, monocrystalline silicon with dimensions of about 0.5-1 cm square and a thickness of some tens to several hundreds of microns, as a rule contains a few million transistors generating heat in operation. The transistors generally are positioned in or near one main surface of the chip. The removal of heat is to take place from the side opposite to the main surface. What solutions have been found so far for dissipating heat in multichip modules are described in detail in the article "Thermal Management of Air- and Liquid-Cooled Multichip Modules" in *IEEE Transactions on Components, Hybrids and Manufacturing Technology*, Vol. CHMT-10, No. 2, June 1987, pp. 159-175. Said article shows that more satisfactory results are attained using water cooling than using air cooling, which is not inconceivable considering that air is essentially a poor coolant. Nevertheless, preference is often given to air cooling on account of the medium's superior handleability.

The invention has for its object to provide a semiconductor module of the type described in the opening paragraph constructed so that superior cooling to that of the known modules is made feasible and even in air cooling more favourable results are attained than could previously be obtained using water cooling.

The semiconductor module according to the invention is comprised of a heat dissipating conductor unit at the side facing away from the chip, said heat dissipating conductor unit being provided with a plurality of projecting closely spaced wire cooling fins of a high thermally conductive material, such as metal, said cooling fins positioned in groups separated from each other by interspaces, which interspaces are connected alternately to an inlet or an outlet for the coolant.

It should be noted that the use of metal wires in heat removal is known in itself. Thus, European Patent Application 082 051 describes a system for cooling electronical elements comprising a pattern of open coils of copper wire soldered to the heat sink of the element formed by a metal sheet. After fixation of the coils they may optionally be cut open, so as to leave a number of loose wires.

From U.S. Pat. No. 4,450,505 a multichip module is known, where at the chips' back side bellows are fixed which are in connection with a space through which a coolant may be passed. A plurality of heat conducting strands extend from the bottom of each of the bellows and hence from a chip's back side into the space for the coolant.

Japanese Patent Application No. 58-200 560(A) describes a system for transferring heat from the chip to the heat sink by means of a flexible wire group that cannot transfer shearing stresses.

IBM Technical Disclosure Bulletin Vol. 21, No. 5, October 1978 (New York, USA) in its article "Brush-tipped Piston for Thermal Conduction" by R. G. Dessauer et al. (p. 1857) describes a different system, in which heat from a chip is transferred by way of the free ends of a bundle of wires of which the other ends are fixed in a spring pressure piston.

In Netherlands Patent Specification 110 715 is described a semiconductor body positioned in a housing and fitted with electrodes, in which the electrode heated most during operation has satisfactory thermally conductive contact with the housing which is of metal at least at the place of contact, with heat being dissipated across a layer of electrically insulating material provided between the metal housing and another component of metal. The construction in this case is such that the insulating layer of synthetic material, which contains, in a manner known in itself, grains of a powdered, high thermally conductive solid insulator, has a plurality of grains of about equal size, with such a small space being chosen between the metal components that the relative distance between the two metal components separated by the insulating layer is equal to the size of these grains.

*Electronics & Power*, Vol. 18, June 1972 (Hitchen, the article "Spherical Diamond Heatsinks" (see p. 235) notes that diamond particles are electrically insulating and thermally conductive. Because of these properties it is proposed that diamond particles provided in a substrate be used in a heatsink in printed circuits with electronic components.

In EP A 0 065 686 a power device module is described with a dielectric substrate provided between the power device and the heat exchanger containing cooling ribs of aluminium. The dielectric substrate is attached to the aluminium heat exchanger with a structural adhesive containing a thermally conductive filler selected from the following group of materials: powdered aluminium, powdered copper, powdered silver, and powdered beryllia.

None of the aforementioned publications disclose a structure in which metal wires are assembled into appropriately shaped groups which are connected to metal foil baffles arranged in an appropriate pattern, as in the present invention.

SUMMARY OF THE INVENTION

In one embodiment, the current invention is a semiconductor module comprised of (1) at least one semiconductor chip, (2) at least one heat dissipating conductor unit, said heat dissipating conductor unit connected to the back side of said semiconductor chip and (3) a plurality of closely spaced wire cooling fins of a high thermally conductive material, said cooling fins attached to the side of the heat dissipating conduct unit facing away from said semiconductor chip and projecting away from said semiconductor chip and further said cooling fin positioned in cooling fin groups, said cooling fin groups separated from each other by interspaces, said interspaces adapted to be connected alternately to an inlet or an outlet for flow of coolant through said semiconductor module.

In a preferred embodiment of the semiconductor module, the cooling fins of each cooling fin group are oriented substantially toward each other in the plane transverse to the longitudinal direction of each group.

Each cooling fin group may be in the form of a triangle. Further, baffles may be positioned on the crest of each triangular shaped cooling fin group, said baffles extending in the longitudinal direction of the cooling fin groups.

In an additional embodiment a sandwich element in the form of an intermediate ply that is both electrically insulating and thermally conductive is positioned between the backside of the semiconductor chip and the heat dissipating conductor unit. The intermediate ply may be comprised of a first layer of soft metal laid down on the surface of the heat dissipating conductor unit, a second thin layer of soft metal laid down on the chips' surface, a polymer material between said first and said second soft metal layers and grains of an electrically insulating and thermally conductive material, said grains positioned in said polymer material and penetrating into said first and second soft metal layers. The grains are preferably diamond.

BRIEF DESCRIPTION OF THE DRAWINGS

The invention will be illustrated with reference to the schematic drawings.

DETAILED DESCRIPTION OF THE INVENTION

Figure 1:
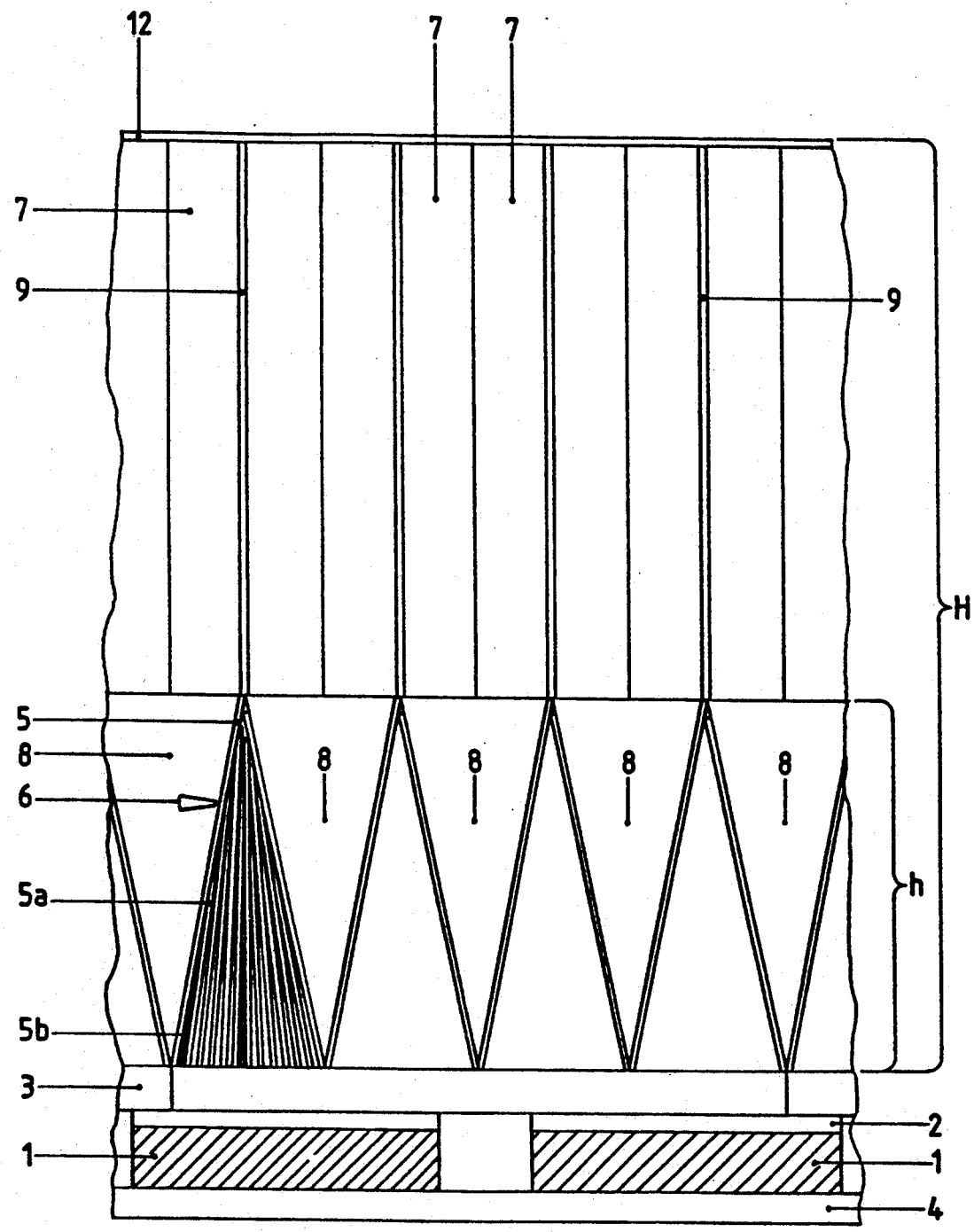
FIG. 1 is a schematic view in cross-section through part of an embodiment of the semiconductor module according to the invention.

The semiconductor module according to the invention is comprised of a heat dissipating conductor unit (also referred to as a "heat sink") at the site facing away from the chip, the heat dissipating conductor unit having a plurality of projecting closely spaced wire cooling fins of a high thermally conductive material, such as metal, the cooling fins positioned in groups separated from each other by interspaces, which interspaces are connected alternatively to an inlet or an outlet for the coolant. Preferably, the semiconductor module has cooling fins positioned in elongated groups separated from each other by elongated interspaces. Another embodiment of the semiconductor module according to the invention provides, measured transverse to their longitudinal direction, the width of the interspaces and the width of the cooling fin groups are larger and smaller, respectively, at some distance from the heat sink than at its surface. Notably the construction according to the invention is such that, measured transverse to their longitudinal direction, the width of the interspaces and the width of the cooling fin groups are larger and smaller, respectively, preferably at least 50%, at a distance from the heat sink of the order of half of the height h of the cooling fin groups than at the heat sink's surface. According to the invention the construction advantageously is such that, measured transverse to their longitudinal direction, the passage of interspaces connected to the coolant inlet has a, preferably gradually, decreasing value in the feed direction, and the passage of interspaces connected to the coolant outlet has a, preferably gradually, increasing value in the discharge direction.

In an especially effective embodiment of the semiconductor module according to the invention, the cooling fin groups each consist of a plurality of cooling fins, which from their place of attachment at the heat spreader plate (heat sink) are oriented or bent more or less toward each other in the plane transverse to the longitudinal direction of the groups. In that case the cooling fins in a group oriented (or bent) toward each other are of different lengths and with their outer circumference by and large form a triangle, with the vertical sides of the triangle bounding said interspaces. Although the cooling fins according to the invention are arranged in specially formed groups of, for instance, approximately triangular cross-section and with similarly shaped interspaces, the wire cooling fins of all cooling fin groups by and large are distributed uniformly at the surface of the heat sink with such places of attachment at the heat sink forming a pattern. In the just discussed embodiment of triangular cooling fin groups, the pattern may be of connecting equilateral triangles. In a particularly advantageous embodiment of the semiconductor module according to the invention the crests of adjacent cooling fin groups extend relative to the heat spreader plate (heat dissipating conductor unit) by a zig-zag pattern. In this case yet another substantial improvement in heat transfer can be achieved when according to the invention there is positioned at the crest of each of the cooling fin groups a baffle extending in the longitudinal direction of the cooling fin groups, such that adjacent baffles, preferably consisting of strips of foil, together with said interspaces form inlet or outlet channels for the coolant.

An effectively cooled semiconductor module according to the invention provides that, measured transverse to their longitudinal direction and at their place of attachment at the heat dissipating conductor unit (typically a heat spreader plate), the maximum width of each of the cooling fin groups is less than the average length of the module's semiconductor chips. This latter aspect enables cooling to take place in such a way that each chip of the entire system has virtually the same temperature and is cooled with fresh cooling air. In a semiconductor module of the current invention intended to be used for cooling with a gaseous coolant, more particularly air, said maximum width of each of the cooling fin groups at the base may be 1-9 mm, preferably 3-6 mm. In a semiconductor module of the current invention intended to be used for cooling with a liquid coolant, more particularly water, said maximum width of each of the cooling fin groups at the base may preferably be 1-2 mm.

In a semiconductor according to the invention module having satisfactory heat dissipation, the wire cooling fins are mounted to the heat sink at a relative centre distance of 0.05-3 mm and have a diameter of at least 20 $\mu$m to 1000 $\mu$m. In a favourable embodiment of the current semiconductor module the distance h from the crest of the cooling fin groups to the heat sink has the value $$\frac{1}{20} H < h < H,$$

wherein H is the distance from the top edge of the baffles to the heat dissipating conductor unit.

Cooling of the semiconductor module according to the invention is preferably carried out using cooling air, although, in principle, use may also be made of some other cooling fluid. The coolant is fed to the gradually narrowing interspaces between the groups of cooling fins in the form of thin wires. Since said interspaces between the groups, and also the spaces between the foil baffles, are narrowing, the coolant is forced to flow between the cooling fins formed of metal wires arranged into groups. On account of the very high number of metal wires, (e.g., 1000 metal wires per cm$^2$) it is possible to attain a high heat removal of the order of 45.10$^4$ W/m$^2$. The coolant travels a long labyrinthine path between the plurality of wire cooling fins, which results in the module according to the invention having a particularly favourable cooling action.

In the device according to the invention it is of importance for the heat generated in a chip to be removed as rapidly as possible. Therefore, the thermal path from chip to coolant should be as short as possible. In addition, however, proper electrical insulation should be provided between the metal heat dissipation spreader plate (if metal) and the back side of each chip. Of course, the metal heat spreader plate in a module will generally be in contact with ground. Often it is not desired that a chip's back side is grounded. As electrical insulators with high thermal conductivity may be mentioned crystalline bodies, such as diamond, cubic boron nitride, and the like.

Such crystals, however, are hard and brittle and poorly suited to be used as sole intermediate ply between the chip surface, which also is hard, and the hard metal sheet. In the module according to the invention use is preferably made of a sandwich element in the form of an intermediate ply between chips and metal sheet. The intermediate ply is comprised of a first thin layer of a soft metal on the metal heat spreader plate, a corresponding second layer of soft metal on the chips' surface, and a layer of a polymer material between the two soft metal layers, with there being incorporated into the polymer material some amount of grains of diamond crystals or similar material of an average dimension larger than the thickness of the polymer layer. As their dimensions exceed the thickness of the polymeric layer, the crystals penetrate into the soft metal layers on either side, so that there is no polymer material between metal and crystal. Thus, favourable thermal conduction is realised from chip to metal sheet. In employing diamond crystals it was found that, if only ten per cent of the contact surface is metal/diamond/metal contact, the thermal conductivity already is about equal to that of a monocrystalline layer of silicon.

FIG. 1 is a schematic view in cross-section through part of an embodiment of the module according to the invention. In this embodiment a number of chips 1 (the actual number in a multichip module can be many tens to hundreds of chips) are fixed by way of an intermediate ply 2 to a heat dissipating conductor unit (heat sink) formed by a spreader plate with high thermal conductivity, such as the metal sheet 3. In each chip a plurality of transistors or other electronic components are provided as is customary, and the electrical connections to these components are realised via a connecting layer 4. The nature and the construction of the layer 4 are extraneous to the present invention and may be of a conventional type known to the skilled man.

The heat generated in operation in the chips 1 is transferred via the intermediate ply 2, which according to the invention is at least composed of an electrically insulating and high thermally conductive layer and of which a highly appropriate embodiment will be dealt with hereinafter, to the metal sheet 3. From there the heat is transferred further via the special construction according to the invention, which is by and large built up of the cooling fin groups which contain a plurality of metal wires and are provided at their crests with baffles of metal foil. Said construction is mounted to the metal sheet 3.

On the side facing away from the chips 1 there are mounted to the metal sheet 3 a plurality of wire cooling fins formed by metal wires 5, which wires 5 project from the surface of the metal sheet 3 as wires of a brush do. The metal wires, which may be of any suitable high thermally conductive material, such as copper or aluminium, have a diameter of, say, 0.1–0.2 mm and are fixed to the surface of the metal sheet, for instance by soldering, at regularly spaced intervals of, say, 0.1–0.7 mm. A "wire brush" may for instance be made by bundling copper wire onto which a soluble material has been extruded, cutting the plurality of strands into sheets of a thickness equal to the desired maximum length of the brush wires, soldering a thus formed sheet onto the metal sheet 3, and removing the soluble material by dissolution.

In a brush of metal wires 5 "grooves" are formed, for instance by etching, in which grooves the metal wires 5 consequently will be shorter than the adjoining wires. Long wires on either side of such "grooves" are then bent toward each other and connected by soldering, so forming the pattern of cooling fin groups 6 with a triangular cross-section and a height h, as illustrated in FIG. 1. As FIG. 1 shows, each of the groups 6 is built up of long wires 5 which generally are tapered on the outside and short to very short wires 5a and 5b, respectively, which are tapered more inward of the row. The pattern of cooling fin groups 6 built up of metal wires 5 will be discussed in more detail hereinafter with reference to the FIGS. 2–7.

Figure 2:
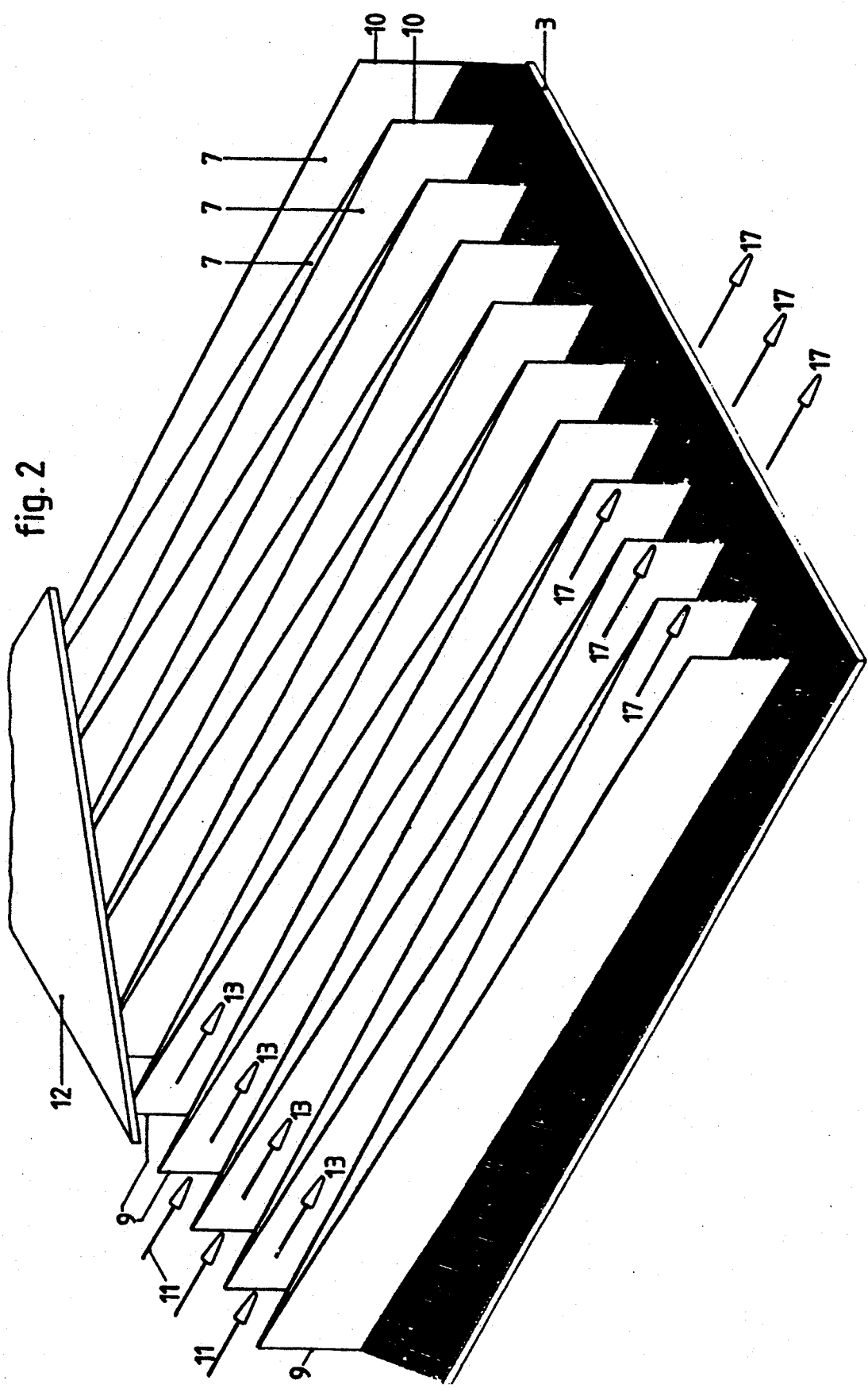
FIG. 2 is an elevational view of part of the system of metal wires assembled into groups in the semiconductor module according to the invention and provided with baffles in the form of strips of metal foil.
Figure 8:
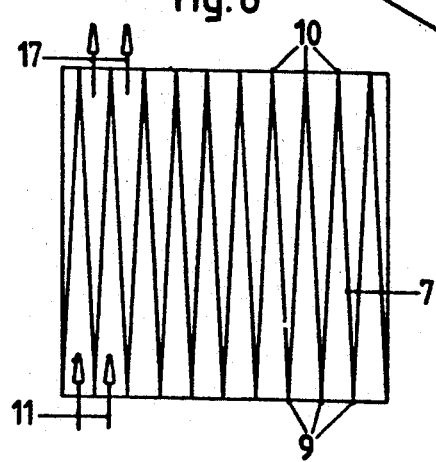
FIG. 8 is a schematic top view of the baffles.

The crest of each cooling fin group 6 is connected to a foil 7 soldered to it, which projects upwards from that group in a direction by and large away from the metal sheet 3. The successive strips of foil 7, which are for instance of copper or aluminium of a thickness of the order of 0.1 mm, in addition are connected to each other in pairs by their front edges 9 and end edges 10, as is shown in FIGS. 2 and 8. Consequently, the strips 7 form baffles for the coolant above the interspaces 8 between the cooling fin groups 6. At their top edges the baffles 7 are covered with a cover 12 attached to them, which may optionally consist of the bottom side of a next multichip module. Air or some other gaseous or liquid coolant is fed from an inlet (not shown) under an appropriate superatmospheric pressure along the direction of the arrows 11 to the air inlet channels between the baffles 7. Since the space between the baffles 7 in the direction of the arrows 13 gradually narrows, the cooling air is directly forced to flow downwards (see arrows 14 in FIGS. 4, 5, and 6) through the interspaces 8 between the successive separated cooling fin groups 6. As also the interspaces 8 narrow in the direction of the arrows 13, the cooling air is forced to flow between the metal wires 5, 5a, and 5b of the cooling fin groups 6, approximately as indicated by the arrows 15. On leaving the cooling fin groups 6 the air heated by heat emission will move upwards again in the interspaces between succesive cooling fin rows 6 as indicated by arrows 16 and move in the direction of the arrows 17 to the air outlet (not shown), i.e. under the influence of the widening in the direction of the arrows 17 of the interspaces 8 connected to the air outlet and the also widening space between the baffles 7. Since the coolant follows a labyrinthine path between the metal wires 5, 5a, and 5b when passing the cooling fin groups, particularly satisfactory cooling is effected.

Figure 3:
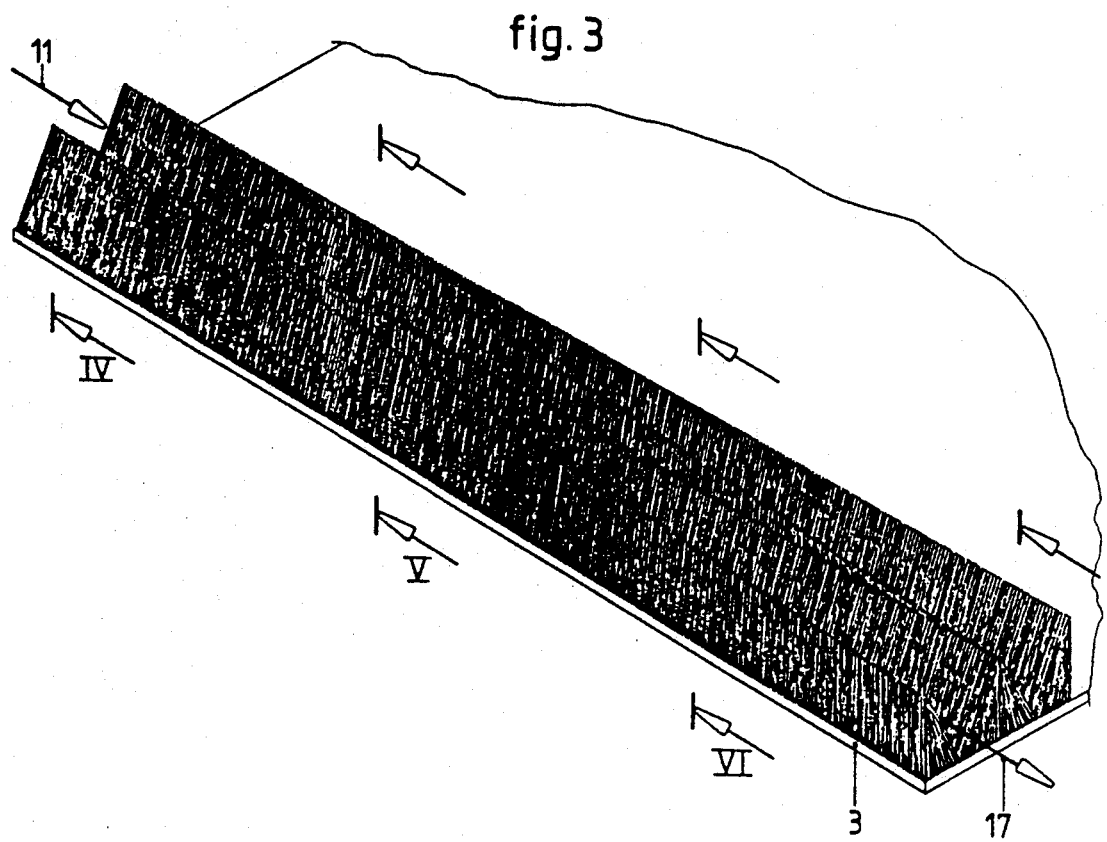
FIG. 3 is an elevational view of part of the semiconductor module illustrated in FIG. 2 with the baffles left out.
Figure 4:
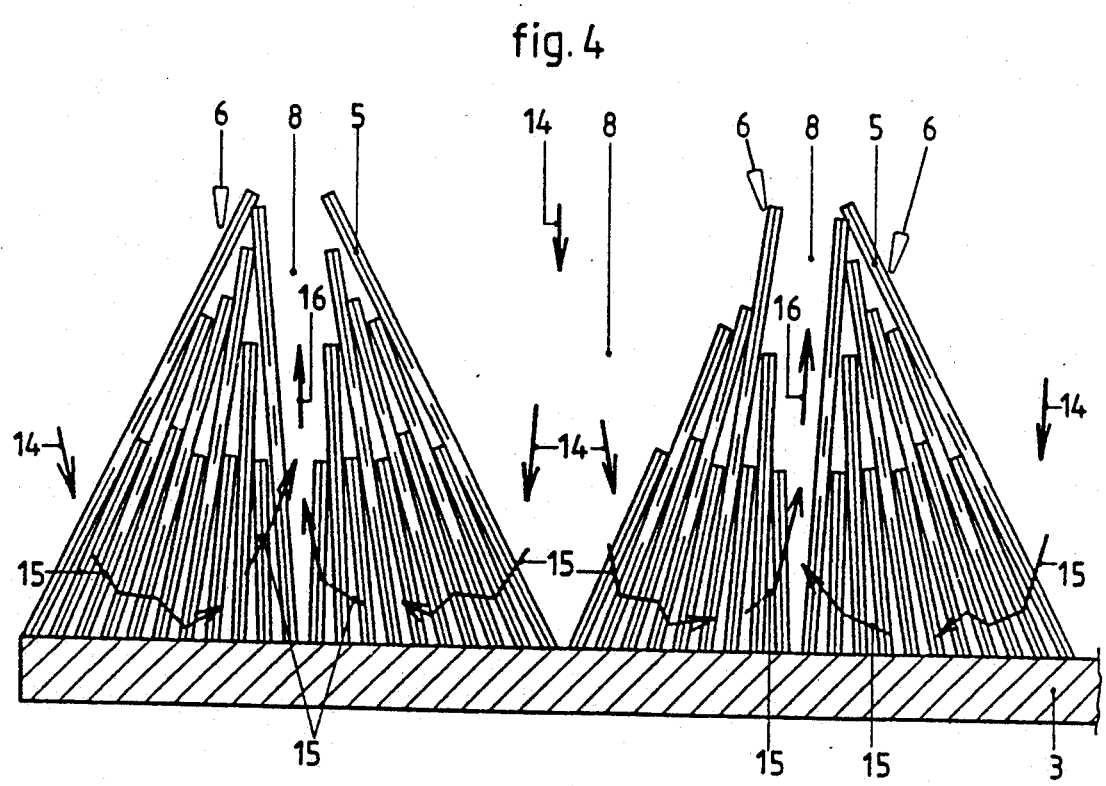
FIGS. 4, 5 and 6 are cross-sections of some cooling fin groups along the surfaces IV, V, and VI of FIG. 3.
Figure 5:
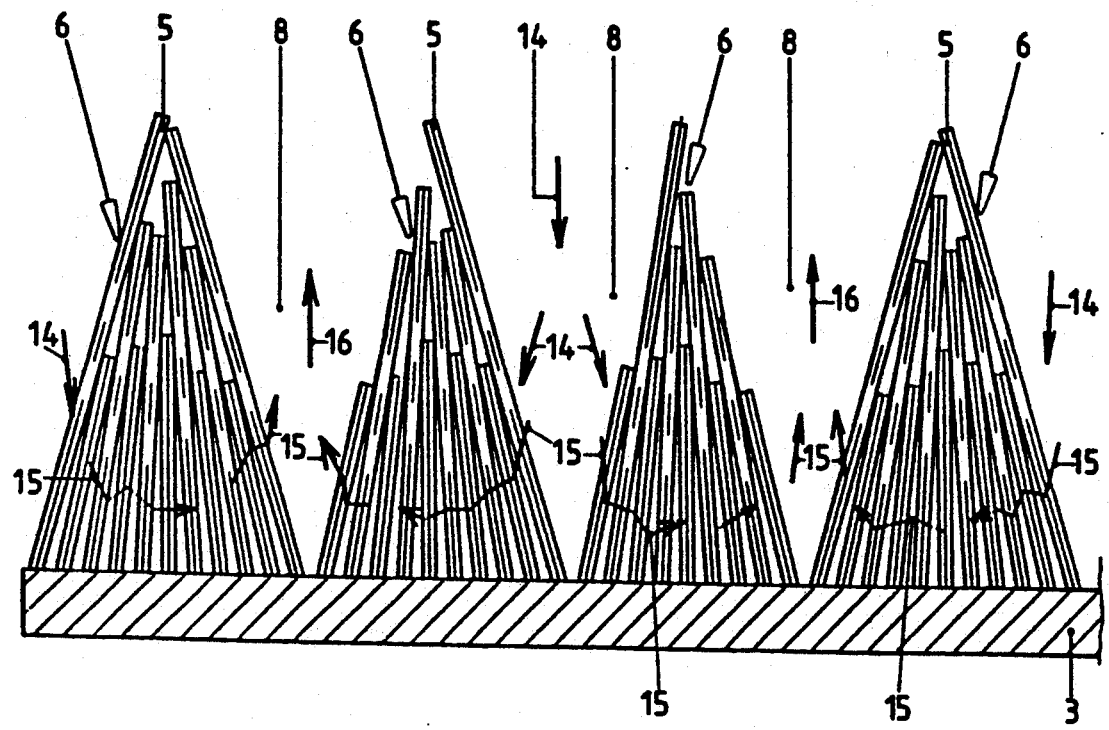
Figure 6:
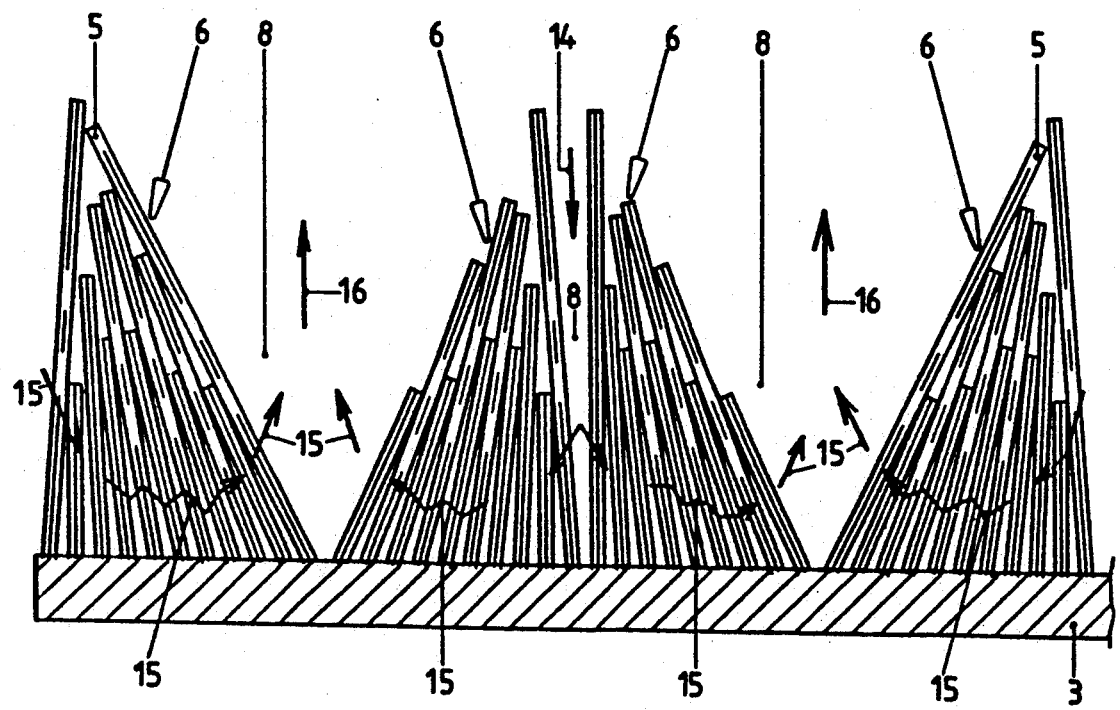
Figure 7:
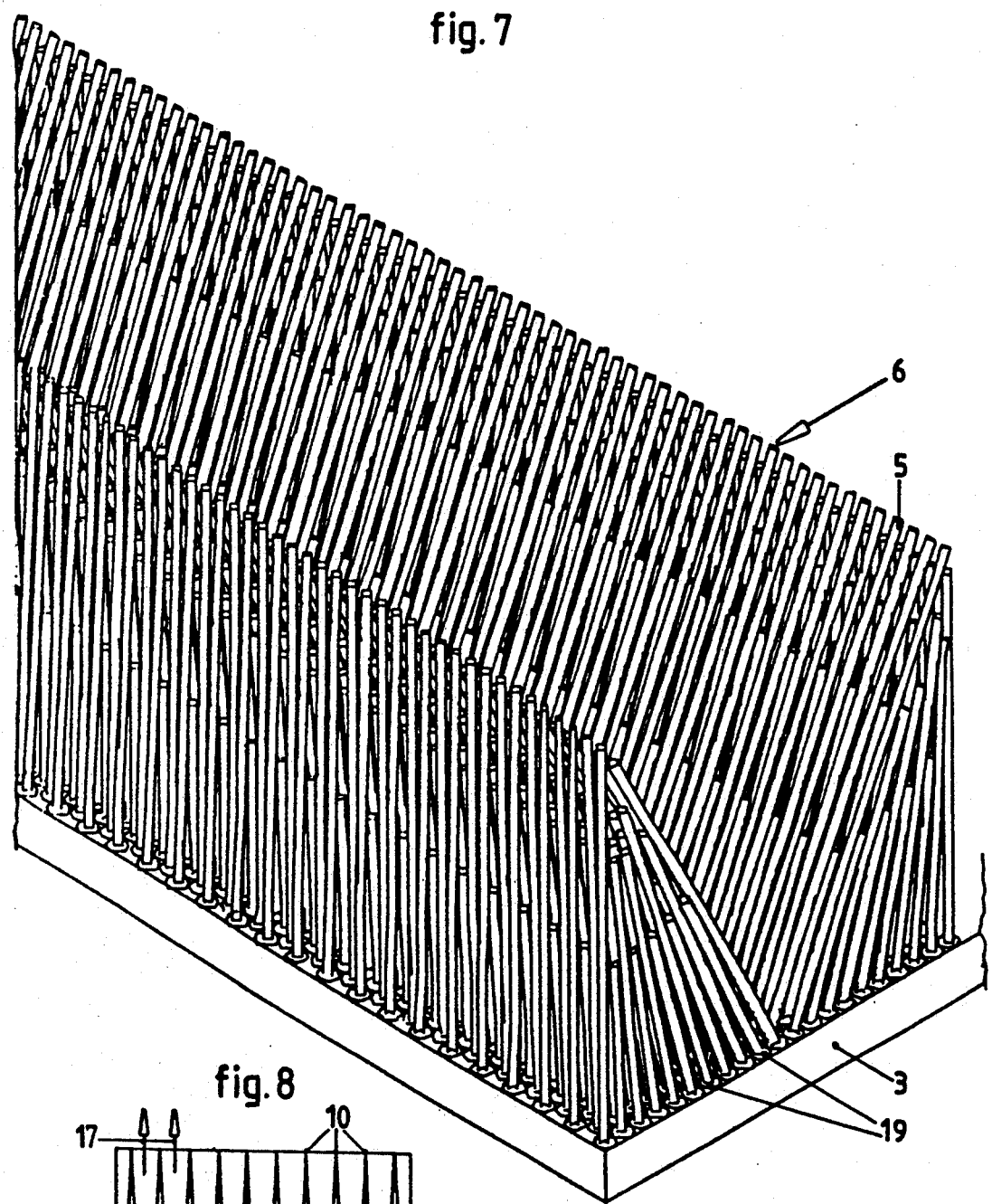
FIG. 7 is a view in perspective on a greatly enlarged scale of some cooling fin groups.

FIG. 7 shows in top view part of the system of metal wires 5 assembled to form cooling fin groups 6 mounted to the metal sheet 3 at a stage prior to metal foil 7 being soldered to the crests of the groups. It is clear that the metal wires 5 are each soldered onto the metal sheet 3 by their foot 19 and arranged in regular rows. The cooling fin groups 6 and the baffles 7 are formed into a zig-zag pattern, as illustrated in FIGS. 2, 3, and 8. A suitable width of the cooling fin groups 6 at their base, i.e. at the metal sheet 3 is, for example, 2.5 mm. The height of the wire rows 6 and the baffles 7 together may be of the order of H=10 mm in all (e.g. height h=6 mm of the cooling fin or wire groups and on top thereof a further 4 mm for the baffles 7). The dimensions are given here only as an example. Optimum values may be determined by a skilled man for every design and each envisaged coolant.

Figure 10:
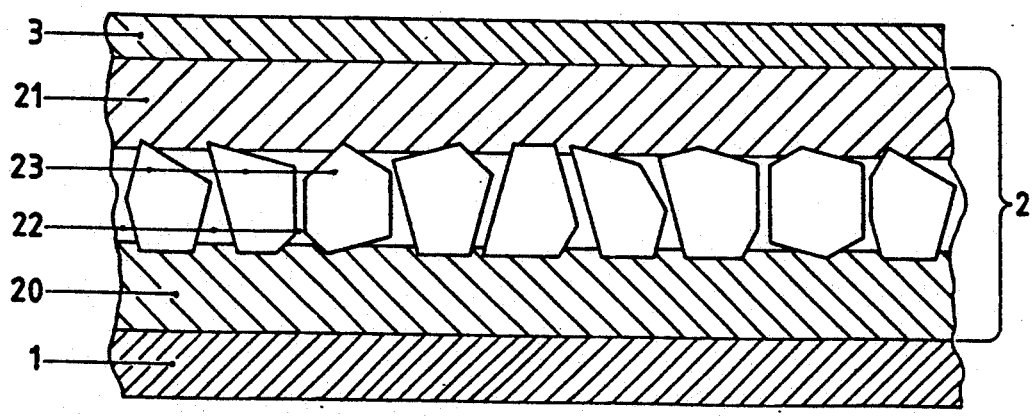
FIG. 10 is a view in cross-section through part of the intermediate ply between the heat dissipating conductor unit and the chip in an embodiment of the semiconductor module according to the invention.

To ensure satisfactory heat dissipation it is of importance that the connection between chip 1 and metal sheet 3 (FIG. 1), i.e. the intermediate ply 2, should have high thermally conductive properties. According to the invention an intermediate ply having such favourable properties can be provided while the also desired property of electrical insulation of metal sheet 3 relative to chip 1 is retained. An embodiment of the device according to the invention having such an intermediate ply is shown in cross-section in FIG. 10 (as regards the essential portion). The intermediate ply 2, also called the "sandwich element", in such an embodiment is a layered or sandwich construction. Such a construction is built up of a thin layer 20 of a soft metal at the side of the chip 1 and a similar thin ply 21 of a soft metal at the side of metal sheet 3. The layers 20 and 21 may be composed of a material selected from the following group of metals: aluminium, copper, nickel, gold, tin, and lead. In between the soft metal layers 20 and 21 of a thickness of 5-100 μm each there is an interface 22 of electrically insulating material. Embedded in layer 22, which may be of polymer, are diamond grains 23. The polymer in layer 22 may be selected from the following group of materials: polyepoxides, polyimides, polyamides, and polyesters. In the "thickness direction" of the sandwich construction at least the greater part of the grains 23 have a dimension exceeding the thickness of the layer 22 in which they are embedded. The grains 23 therefore penetrate directly into the soft metal layers 20 and 21, respectively, at the bottom and the top. The average thickness of the interface 22, measured across the ends of the grains extending into the layers 20 and 21 is, e.g., 2-200 μm.

The size of the grains and the thickness of the layers 20, 21 and 22 are tailored to each other in such a way that the grains make direct contact with neither chip 1 nor metal sheet 3. The maximum thickness of the grains is, e.g., 2-200 μm and the material of the grains may be selected from the following group of materials: diamond, aluminum nitride, cubic boron nitride, and beryllium oxide.

The function of the soft metal layers in the described sandwich construction of the sandwich element is to conform to the surfaces of chip 1 and metal sheet 3, respectively. The function of the matrix or embedding material is to hold the construction together and to provide the required flexibility. The diamond grains (having a dimension of, for example, 20 microns) provide the desired thermal conduction from chip 1 to metal sheet 3. Said grains have a thermal conductivity of, e.g., 50–2000 W/m °K. and their specific electrical resistance R is $10^{10}$ to $10^{15} \Omega m$.

Figure 9:
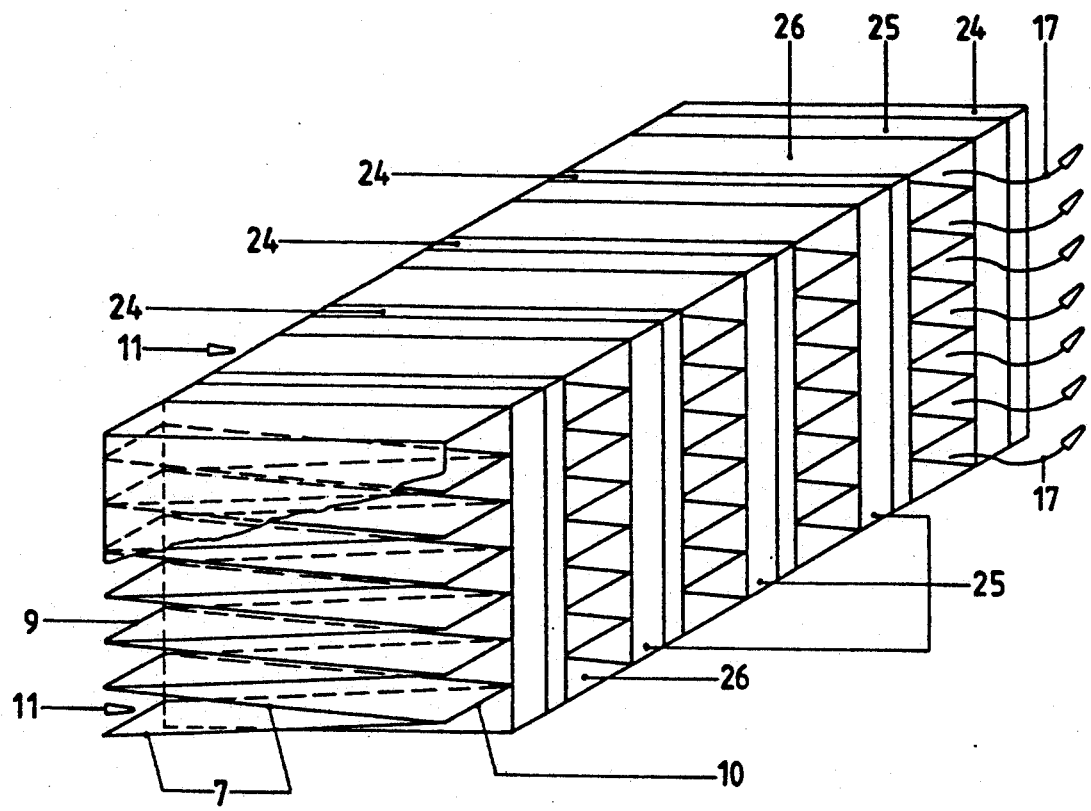
FIG. 9 is a schematic illustration of a stack of semiconductor modules according to the invention.

FIG. 9 is a schematic illustration of how in actual practice a number of modules according to the invention can be made into a stack. The disc-shaped parts 24 of each module in this case comprise the chips 1 and the connecting layer 4 and the disc-shaped parts 25 of each module comprise the sandwich element or intermediate ply 2, the metal sheet 3, and the cooling fin groups construction 6, i.e. as indicated in FIG. 1. As the arrows 11 indicate, cooling air is blown into the channels formed by the metal foil baffles 7. The package of metal foil baffles as a whole is always indicated with 26 and is positioned between the disc-shaped parts 24 and 25. After having carried out its cooling operation the air exits again on the other side of the stack, as indicated by the arrows 17.

The two examples below serve to illustrate the invention.

EXAMPLE 1

Use is made of a semiconductor module for a mainframe computer under the following selected conditions:

The whole cooling device, i.e. the metal wires (5, 5a, 5b), the metal sheet 3, the metal foil baffles 7, and the sheets 20 and 21 are of copper.

The coolant used is air.

The overall height H (see FIG. 1) is 20 mm.

The depth of the device, measured in longitudinal direction of the cooling fin rows 6 is 100 mm.

The diameter of the wires 5, 5a, 5b is 0.1 mm.

The difference in temperature between the incoming air and the chip junction is 50° K., which leads to a chip surface temperature of about 350° K.

Calculations based on the aforementioned starting data will give an optimum heat exchanger, of which the parameters mentioned hereinafter should have the values listed for them:

The height h (see FIG. 1) of the fin rows 6 should be 6.5 mm, so that the height of the foil baffles 7 will be 13.5 mm.

The centre distance between the wires (5, 5a, 5b) at their place of mounting to the metal sheet 3 (fin spacing) has to be 0.160 mm.

The pitch of the fin rows 6 and the foil baffles 7 arranged in a zig-zag pattern, i.e. the space between the front edges 9 of two successive strips of foil, should be 2.7 mm.

The ratio of pumping power, i.e. cooling air transfer power, to dissipated heat should be 0.4.

By using the parameters given in this example there is obtained a semiconductor module having a heat dissipation capacity of the order of 55W/cm², which it has to be stated is particularly favourable.

EXAMPLE 2

In the case of a semiconductor module intended for a personal computer a different criterion usually applies, viz. a low noise production level. This can be achieved by reducing the velocity of the coolant in the device to 1 m/sec. Again, the whole cooling device is assumed to be of copper and the coolant used ambient air. The overall height H and aforementioned depth of the device were both chosen to be 50 mm, and the difference in temperature between the incoming air and the chip surface again was 50° K. The height h of the fin rows 6 was 10 mm, so that the height of the foil baffles 7 was 40 mm. The diameter of the wires (5, 5a, 5b) was 0.200 mm, and the center distance between them at their place of mounting to the metal sheet 3 was 0.400 mm. The desired pitch of the fin rows 6 and the foil baffles 7 arranged in a zig-zag pattern was 5 mm. Calculations based on this data teach that said ratio of pumping power for cooling air to dissipated heat is 0.003. By using the parameters given in this example there is obtained a semiconductor module which, while maintaining a low noise production level, achieves a heat dissipation capacity of the order of about 10W/cm², which it has to be stated is particularly favourable.

Within the scope of the invention various changes can be made. Notably, the wire elements need not have a circular diameter, but use may also be made of wires of any given other shape of diameter, for instance flat, polygonal, or lobate.

One of the surfaces between chip and heat sink may be lubricated, so that in thermal cycling the chip is not under stress. The chip may be continually pressed against the heat sink by a drop of silicone rubber on the active side. This drop functions also as the water scavenger.

I claim:

1. A semiconductor module comprised of (1) at least one semiconductor chip, (2) at least one heat dissipating conductor unit, said heat dissipating conductor unit connected to the back side of said semiconductor chip, and (3) a plurality of closely spaced wire cooling fins of a high thermally conductive material, said cooling fins being attached to the side of the heat dissipating conductor unit facing away from said semiconductor chip and said cooling fins projecting away from said semiconductor chip, wherein said cooling fins are positioned in cooling fin groups separated from each other by interspaces having a longitudinal direction substantially parallel to said heat dissipating conductor unit, said cooling fin groups comprising closely spaced wires and being adapted to provide fluid communication between the adjacent interspaces, said interspaces alternately being inlets and outlets for the flow of coolant through said cooling fin groups.

2. A semiconductor module according to claim 1, wherein measured transverse to their longitudinal direction, the interspaces that are inlets for the flow of coolant through the cooling fin groups have a decreasing cross-section in the coolant feed direction, and the interspaces that are outlets for the flow of coolant through the cooling fin groups have an increasing cross-section in the coolant discharge direction.

3. A semiconductor module according to claim 1 wherein the cooling fins of each cooling fin group are oriented substantially toward each other in the plane transverse to the longitudinal direction of each group.

4. A semiconductor module according to claim 3 wherein the cooling fins of each cooling fin group are oriented toward each other and further the cooling fins of each cooling fin group are of varying lengths and the outer perimeter of each cooling fin group forms a triangle wherein the slants of said triangle bound said interspaces.

5. A semiconductor module according to claim 4 wherein the cooling fins of all cooling fin groups are distributed uniformly at the surface of the heat dissipating conducting unit.

6. A semiconductor module according to claim 4 wherein the crests of adjacent cooling fin groups extend relative to the heat dissipating conductor unit by a zig-zag pattern.

7. A semiconductor module according to claim 6 wherein there is positioned at the crest of each of the cooling fin groups a baffle extending in the longitudinal direction of the cooling fin groups such that adjacent baffles together with said interspaces form an inlet or an outlet for the coolant.

8. A semiconductor module according to claim 1 wherein, measured transverse to the cooling fin group longitudinal direction and at the cooling fin group position on the heat dissipating conductor units, the maximum width of each of the cooling fin groups is less than the average length of the semiconductor chip.

9. A semiconductor module according to claim 1 adapted for use with a gaseous coolant wherein said maximum width of each of the cooling fin groups at the base is 3-9 mm.

10. A semiconductor module according to claim 1 adapted for use with a liquid coolant wherein said maximum width of each of the cooling fin groups at the base is 1-2 mm.

11. A semiconductor module according to claim 1 wherein the wire cooling fins are mounted to the heat dissipating conductor unit at a relative centre distance of 0.05-3 mm.

12. A semiconductor module according to claim 1 wherein each cooling fin has a diameter of 20 to 1000 $\mu$m.

13. A semiconductor module according to claim 7 wherein the distance h from the crest of the cooling fin groups to the heat dissipating conductor unit has the value $$\frac{1}{20} H < h < H,$$

wherein H is the distance from the top edge of the baffles to the heat dissipating conductor unit.

* * * * *